United States Patent
Reefman et al.

(10) Patent No.: US 6,819,275 B2
(45) Date of Patent: Nov. 16, 2004

(54) AUDIO SIGNAL COMPRESSION

(75) Inventors: Derk Reefman, Eindhoven (NL); Petrus Antonius Cornelis Maria Nuijten, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 26 days.

(21) Appl. No.: 10/129,695

(22) PCT Filed: Sep. 6, 2001

(86) PCT No.: PCT/EP01/10336
§ 371 (c)(1),
(2), (4) Date: May 8, 2002

(87) PCT Pub. No.: WO02/21525
PCT Pub. Date: Mar. 14, 2002

(65) Prior Publication Data
US 2002/0163455 A1 Nov. 7, 2002

(30) Foreign Application Priority Data
Sep. 8, 2000 (EP) .............................. 00203097

(51) Int. Cl.$^7$ .......................... H03M 3/00; G10L 19/00; G10L 21/00
(52) U.S. Cl. ........................ 341/143; 704/216; 704/500
(58) Field of Search ...................... 341/143; 704/216, 704/500, 217, 218, 200.1, 503; 381/315, 106, 312; 455/72; 360/49; 700/94; 369/124.01

(56) References Cited

U.S. PATENT DOCUMENTS

| | | | |
|---|---|---|---|
| 5,594,598 A | 1/1997 | Shikakura | .................... 360/49 |
| 5,835,043 A | 11/1998 | Tsuchida et al. | ............ 341/143 |
| 6,097,824 A * | 8/2000 | Lindemann et al. | ........ 381/315 |
| 6,138,101 A * | 10/2000 | Fujii | ........................... 704/500 |
| 6,311,153 B1 * | 10/2001 | Nakatoh et al. | ............. 704/216 |
| 6,326,912 B1 * | 12/2001 | Fujimori | ..................... 341/143 |
| 6,426,934 B1 * | 7/2002 | Inayama | ................ 369/124.01 |
| 6,434,246 B1 * | 8/2002 | Kates et al. | ................. 381/312 |
| 6,477,490 B2 * | 11/2002 | Nakatoh et al. | ......... 704/200.1 |

FOREIGN PATENT DOCUMENTS

| | | | |
|---|---|---|---|
| EP | 907258 | * 4/1999 | |
| WO | WO9816014 | 9/1997 | ............ H03M/7/30 |
| WO | WO9820488 | 9/1997 | ........... G11B/20/10 |
| WO | WO0221526 | 3/2002 | ........... G11B/20/00 |

OTHER PUBLICATIONS

"Super–Andio–CD von Philips und Sony", Elektronic Sep. 1998, XP–000782872.
"Die Super–Audio–Disk" by C. Dijkmans, Fernseh–Und Kino–Technik 51, Jahrgang No. Apr. 1997.
"Stability Analysis of an Adaptive Structure for Sigma Delta Modulation", by Aldajani et al, XP–002286459, 2000.
"The Heart and Soul fo the Next Generation Audio System" Sharp XP–002186458, 1999.
"Research on Casondable Filtering, Equalisation, Gain Control, and Mixing of 1–bit Signals for Professional Audio Application", by Eastly et al, Audio AKS, Reprint 6444(G2), 2001.
"Super Audio CD from Philips and Sony", by Claus Reuber, Electronics Sep. 1998.
"The Super Audio Disc", by C. Dijkmans, TV and Film Technology, Apr. 1997.

* cited by examiner

Primary Examiner—Patrick Wamsley

(57) ABSTRACT

Estimating a compression gain obtainable in compressing a given audio signal, comprising extracting a signal power in a selected frequency band of the given audio signal, and obtaining an estimation of the compression gain by correlation with the extracted signal power.

11 Claims, 2 Drawing Sheets

AUDIO SIGNAL COMPRESSION

FIELD OF THE INVENTION

The present invention relates to audio signal compression.

BACKGROUND OF THE INVENTION

International Patent Application WO 98/16014 discloses a data compression apparatus for data compressing an audio signal. The data compression apparatus comprises an input terminal for receiving the audio signal, a 1-bit A/D converter for A/D converting the audio signal so as to obtain a bitstream signal, a lossless coder for carrying out a lossless data compression step on the bit-stream signal so as to obtain a data compressed bit-stream signal, and an output terminal for supplying the data compressed bit-stream signal. Further, a recording apparatus and a transmitter apparatus comprising the data compression apparatus are disclosed. In addition, a data expansion apparatus for data expanding the data compressed bit-stream signal supplied by the data compression apparatus is disclosed, as well as a reproducing apparatus and a receiver apparatus comprising the data expansion apparatus.

It is an object of the invention to provide advantageous compression gain estimation in audio compressing. To this end the invention provides a method and device for estimating a compression gain, a recording apparatus and a transmitter as defined in the independent claims. Advantageous embodiments are defined in the dependent claims.

A compression gain estimation can be used in authoring and/or editing of audio signal sequences such as music pieces. It may be used for control of signal processing parameters, such as adaptive control of the compression ratio by compressive encoding, to allow recording of the content of e.g. a music piece within the limited maximum storage content of a recording medium such as a Super Audio Compact Disc (SACD) by providing a quick estimate of the amount of data that can be stored or recorded on the storage or recording medium.

Theoretically, to produce such an estimate it could be envisaged to use the average actual compression ratio or coding gain for a small fraction of an audio signal sequence such as a piece of music as an indication of the compression ratio for the entire sequence. Such an approach would suffer, however, from the problem that typical audio signal sequences in the form of music pieces have a rather wide variation of compression ratios or coding gains with significant short-time correlations, whereby a very significant fraction of the signal sequence would have to be used for obtaining a compression ratio estimate having the required level of precision or accuracy. Due to the required time for computation such a solution would in practice not be acceptable.

SUMMARY OF THE INVENTION

According to a first aspect of the invention an advantageous estimate of the obtainable compression gain is obtained by extraction of a signal power contained in a selected frequency band of the audio signal and obtaining said estimate by correlation with the extracted signal power. This aspect of the invention is based on the insight that a quick estimate of the compression ratio or coding gain can be obtained by using a correlation between the signal power of an audio signal and the compression gain. This aspect is especially advantageous in losslessly compressing 1 bit bit-stream signals e.g. in Direct Stream Digital format.

It is noted that from standard PCM coding it is known that the attainable coding gain is directly related to the degree of structure (flatness) in the signal power. However, in the above aspect of the invention the signal power itself is used, not its structure.

In the following the invention will be further explained with reference to the accompanying drawings, in which

DETAILED DESCRIPTION OF THE INVENTION

Figure 1:
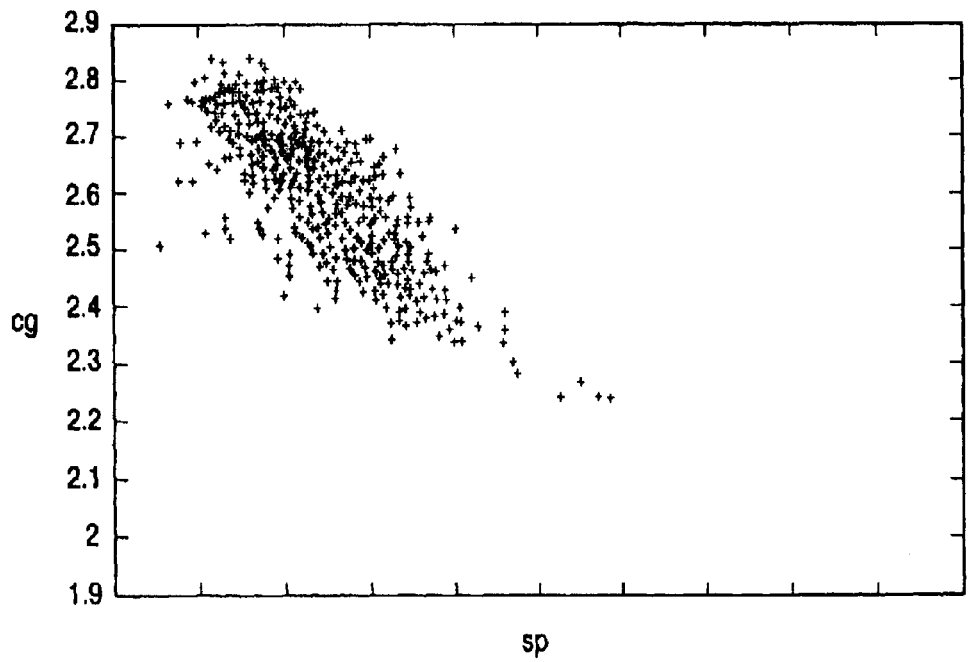
FIG. 1 is a graphic representation of the relationship between compression gain and signal power in a selected frequency band of an audio signal.

Whereas investigations for a lossless encoder have demonstrated that in the audio signal band itself, e.g. up to 20 kHz a relatively flat response curve exists for the compression ratio as function of the signal power, a significant steep response of the compression gain cg in dependence of the signal power sp is obtained for a signal band outside the audio signal band, e.g. as illustrated in FIG. 1 for the signal band from 20 to 50 kHz.

Figure 2:
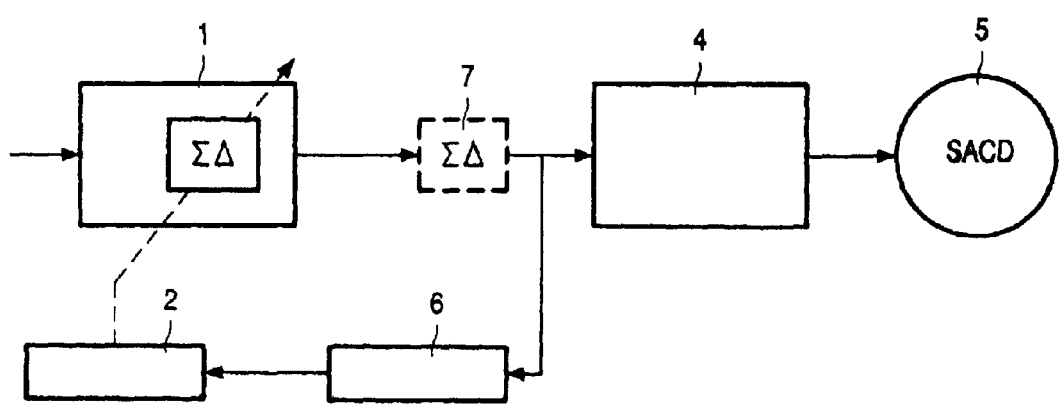
FIG. 2 is a simplified block diagram of a digital audio signal recording or transmission chain incorporating an embodiment of a signal processing apparatus according to the invention, and FIG. 3 a simplified topology diagram of a 5th order sigma-delta modulator for use in the signal processor in the block diagram in FIG. 2.

In the signal processing apparatus represented by the block diagram in FIG. 2 this distinctive correlation is used to obtain an estimate of the compression ratio or coding gain obtained by lossless encoding. An input audio signal, which may be an analog or a digital signal is supplied to a signal processor 1, in which the input audio signal is processed in dependence of at least one variable processing parameter determined by a parameter control device 2. In the example illustrated, the control signal generated by the control device 2 controls adaptation of an adaptive sigma-delta modulator 3, which produces a data-stream signal in the so-called DSD (Direct Stream Digital) format, such as a 1 bit bit-stream signal, as output signal from the signal processor 1 to be sup-plied to the lossless encoder 4. The compression gain obtained in the encoder 4 may be significantly affected by variation of the variable parameter used for control of the signal processor 1, which in result may strongly affect the amount of data that can be recorded or stored by the recording medium, which is represented in FIG. 2 by a SACD recording on a DVD disc 5. Reference is made to co-pending application of the same applicant entitled 'Audio signal processing' having the same priority date as this application.

According to an embodiment of the invention a correlation as represented in FIG. 1 between the signal power of the bit-stream signal in the DSD format and the compression gain is used to provide a quick and accurate estimate of the coding gain. As shown the signal power may be extracted from the bit-stream signal by an extraction and correlation device 6 connected with the output from the signal processor 1 and supplying the compression ratio or coding gain estimate as an input control signal to the parameter control device 2.

As shown the parameter controlled component of the signal processor 1 may typically be an adaptive sigma-delta modulator 3 and several approaches can be used for adaptation or modification of the structure of such a sigma-delta modulator such as shifting between sigma-delta modulator structures of different order or creation of structure in the high frequency noise of the modulator.

Thus, by shifting between modulator structures of the 3rd, 5th or 7th order compression ratios may be obtained ranging typically from about 3.7 for a 3rd order structure down to only 2.3 or lower for a 7th order structure and this can be used to shape the amount of data in the compressed bit-stream signal from the encoder 4 to fit within the limited record-ing or storage capacity of the recording medium such as the DVD disc 5.

Figure 3:
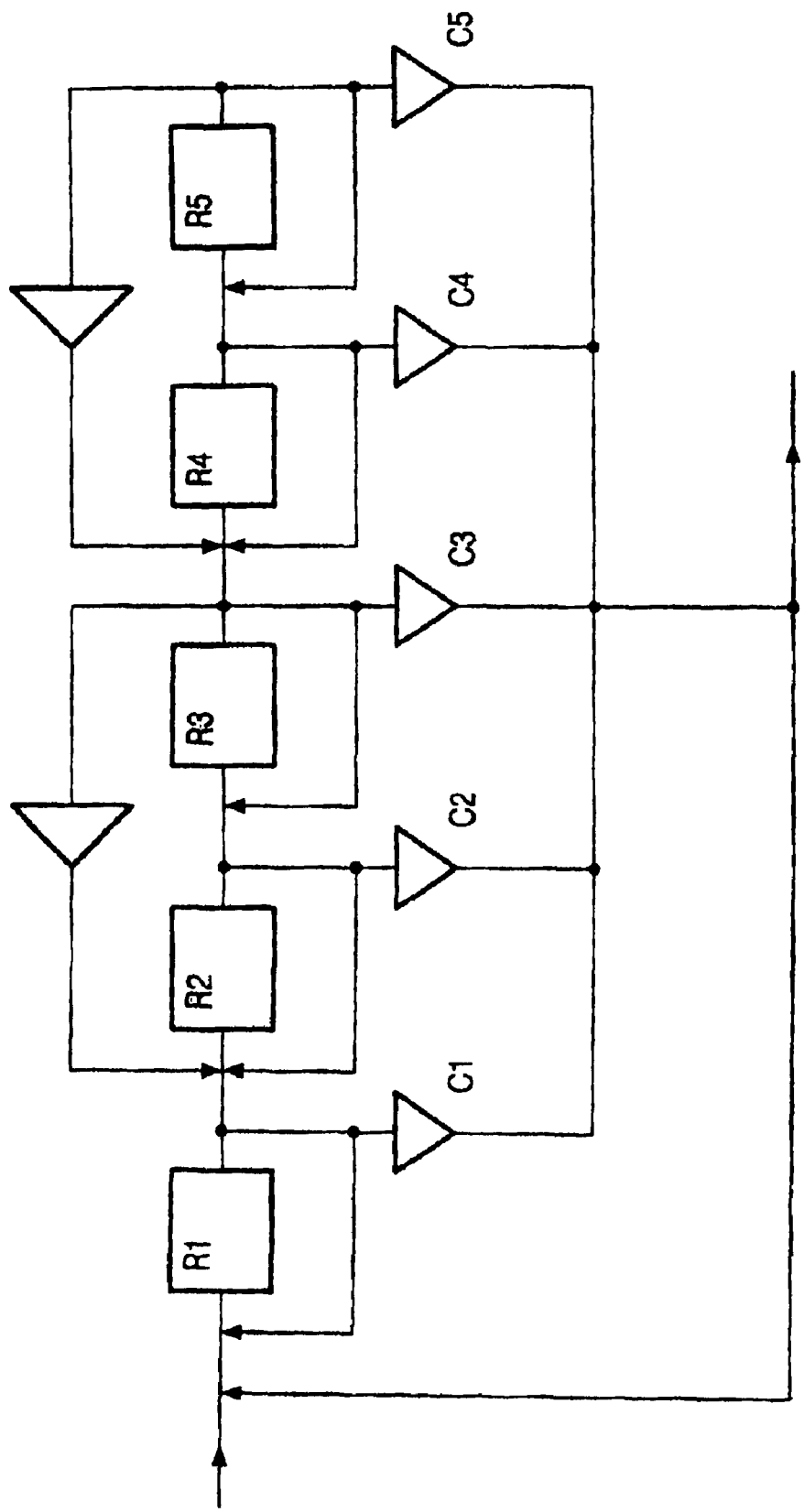

The diagram in FIG. 3 shows a preferred topology of a 5th order sigma-delta modulator for use in the signal processor 1 in FIG. 2. The illustrated topology is based on a multiple resonator structure, in which the coefficients $c1, c2, \ldots c5$ in the feed-back loops of resonators $R1, R2, \ldots R5$ determine the poles of the loop filters (or zeroes of the noise transfer function). Whereas the illustrated topology is for a 5th order modulator the same topology may be used for a 7th order modulator just by adding another resonator structure.

In ordinary design of a such a sigma-delta modulator the poles will normally be positioned in the audio band, According to the invention it is preferred, however, to have at least one pole positioned outside the audio band to create additional structure in the—otherwise almost flat—high frequency part of the sigma-delta spectrum.

Thus, whereas in standard designs of sigma-delta modulators the poles are typically positioned at 8.7, 15.7 and 19.5 kHz, the last pole is, in accordance with the invention, preferably shifted from the 20 kHz region to a higher frequency region, e.g. around 300 kHz or higher, which may lead to a significant increase of compression gain. Although this may be accompanied by a slight decrease of the signal-to-noise performance, this would normally be quite acceptable, because the extra noise is introduced on the high side of the frequency band, where the human ear is less sensitive.

The shifting of the pole position from the 20 kHz region towards higher frequencies can be effected by addition of a separate extra band pass filter to the existing modulator structure, e.g. in parallel to the low-pass loop filter. By use of a 2nd order Butter-worth band pass filter for such a parallel filter a significant increase of compression gain can be realized with the resulting modulator remaining stable for large inputs and the signal-to-noise performance in the audio band remaining virtually unchanged with respect to an unmodified modulator.

To take account of the fact that shifting between different sigma-delta modulator structures may cause variation in the relation between the signal power in a certain frequency band of the bit-stream signal and the compression ratio or coding gain and may thereby affect the correlation used as basis for the estimation of the compression ratio, it may be advantageous to use an initial calibration process to fix the correlation.

For this purpose a fixed sigma-delta modulator may be incorporated as a final processing device be-fore the lossless encoder 4 as shown by the block 7 drawn in dashed lines in FIG. 2. Thereby, the signal power should preferably be extracted from the signal supplied from the fixed sigma-delta modulator 7 to the lossless encoder 4.

Whereas in the signal processor embodiment described above and shown in FIG. 2 an adaptive sigma-delta modulator is used to adapt or modify the compression ratio or coding gain in response to the correlation obtained from the signal power of the bit-stream signal other approaches, such as reduction of the signal level of incorporation of a band-width limiting low-pass filter in the signal processor before a sigma-delta modulator, that may be adaptive or fixed, may be used either separately or in combination.

Moreover, a signal processing apparatus for carrying out the method according to embodiments of the invention need not by itself comprise compressive encoding means, in as much as the estimate of the compression ratio obtainable in subsequent compressive encoding may be used separately, e.g. in a studio environment for pure evaluation, formatting, authoring and/or editing of an audio signal sequence.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word 'comprising' does not exclude the presence of other elements or steps than those listed in a claim. The invention can be implemented by means of hardware comprising several distinct elements, and by means of a suitably programmed computer. In a device claim enumerating several means, several of these means can be embodied by one and the same item of hardware. The mere fact that certain measures are recited in mutually different dependent claims does not indicate that a combination of these measures cannot be used to advantage.

What is claimed is:

1. A method of estimating a compression gain obtainable in compressing a given audio signal, the method comprising the steps of:

extracting a signal power in a selected frequency band of the given audio signal by a control device that controls adaptation of an adaptive sigma-delta modulator to produce a data-stream signal in Direct Stream Digital (DSD) format, and obtaining an estimation of the compression gain by correlation with the extracted signal power.

2. A method as claimed in claim 1, wherein said selected frequency band is from 20 to 50 kHz.

3. A method as claimed in claim 2, wherein said selected frequency band is from 20 to 50 kHz.

4. A method as claimed in claim 1, wherein the audio signal is a 1-bit noise shaped digital signal.

5. A method as claimed in claim 1, wherein the compressing is lossless.

6. A method of recording an audio signal on a recording medium, the method comprising the steps of:

compressing the audio signal to obtain a compressed audio signal, recording the compressed audio signal on the recording medium, the method further comprising:

estimating a compression gain obtainable in the compressing step by extracting a signal power in a selected frequency band of the audio signal by a control device that controls adaptation of an adaptive sigma-delta modulator to produce a data-stream signal in Direct Stream Digital (DSD) format, and obtaining an estimation of the compression gain by correlation with the extracted signal power, controlling said compressing depending on said estimated compression gain.

7. A method as claimed in claim 6, wherein said compressing step comprises:

converting the audio signal into a digital signal by an adaptive noise-shaping modulation in response to the estimated compression gain.

8. A method of transmitting an audio signal, the method comprising the steps of:

compressing the audio signal to obtain a compressed audio signal, transmitting the compressed audio signal over a transmission medium, the method further comprising:

estimating a compression gain obtainable in the compressing step by extracting a signal power in a selected frequency band of the audio signal by a control device that controls adaptation of an adaptive sigma-delta modulator to produce a data-stream signal in Direct Stream Digital (DSD) format, and obtaining an estimation of the compression gain by correlation with extracted signal power, controlling said compressing depending on said estimated compression gain.

9. A device for estimating a compression gain obtainable in compressing a given audio signal, the device comprising:

means for extracting a signal power in a selected frequency band of the given audio signal by a control device that controls adaptation of an adaptive sigma-delta modulator to produce a data-stream signal in Direct Stream Digital (DSD) format, and means for obtaining an estimation of the compression gain by correlation with the extracted signal power.

10. A recording apparatus for recording an audio signal on a recording medium, the recording apparatus comprising:

means for compressing the audio signal to obtain a compressed audio signal, means for recording the compressed audio signal on the recording medium, the recording apparatus further comprising:

a device as claimed in claim 9 for estimating a compression gain obtainable in the compressing, means for controlling said compressing depending on said estimated compression gain.

11. A transmitter for transmitting an audio signal, the transmitter comprising:

means for compressing the audio signal to obtain a compressed audio signal, means for transmitting the compressed audio signal over a transmission medium, the transmitter further comprising:

a device as claimed in claim 9 for estimating a compression gain obtainable in the compressing, means for controlling said compressing depending on said estimated compression gain.

* * * * *